United States Patent
Yao

(10) Patent No.: US 11,143,708 B2
(45) Date of Patent: Oct. 12, 2021

(54) ELECTRONIC DEVICE AND METHOD FOR OBTAINING A CORRECT BATTERY TEMPERATURE

(71) Applicant: Dongguan Amperex Technology Limited, Dongguan (CN)

(72) Inventor: Yuan Yao, Dongguan (CN)

(73) Assignee: DONGGUAN AMPEREX TECHNOLOGY LIMITED, Guangdong (CN)

( * ) Notice: Subject to any disclaimer, the term of this patent is extended or adjusted under 35 U.S.C. 154(b) by 232 days.

(21) Appl. No.: 16/540,333

(22) Filed: Aug. 14, 2019

(65) Prior Publication Data

US 2020/0300918 A1 Sep. 24, 2020

(30) Foreign Application Priority Data

Mar. 22, 2019 (CN) .......................... 201910224018.2

(51) Int. Cl.
*G01R 31/374* (2019.01)
*H01M 10/48* (2006.01)
*G01R 31/382* (2019.01)

(52) U.S. Cl.
CPC ......... *G01R 31/374* (2019.01); *G01R 31/382* (2019.01); *H01M 10/486* (2013.01)

(58) Field of Classification Search
CPC . G01R 31/374; G01R 31/382; H01M 10/486; H01M 10/42; H01M 10/425;
(Continued)

(56) References Cited

U.S. PATENT DOCUMENTS

| 10,005,373 B2 * | 6/2018 | Morikawa | H02J 7/04 |
| 2005/0189919 A1 * | 9/2005 | Tsuchiya | G01R 31/374 320/132 |

(Continued)

FOREIGN PATENT DOCUMENTS

| CN | 105510830 A | 4/2016 |
| CN | 105633498 | 6/2016 |

(Continued)

*Primary Examiner* — Nha T Nguyen
(74) *Attorney, Agent, or Firm* — Morgan, Lewis & Bockius LLP

(57) ABSTRACT

A method for correcting temperature of a rechargeable battery is provided. The temperature T of an adapter board of the rechargeable battery is detected by a sensor of an electronic device, and a temperature difference $\Delta T_i$ between a cell and the adapter board is calculated during charging or discharging of the battery for a predetermined time period by acquiring a predetermined relationship mode. A cumulative temperature difference $\Delta T$ is calculated by accumulating the delta T value $\Delta T_i$, and a temperature value $T_{cell}$ of the cell is calculated through the detected temperature T minus the accumulated temperature difference $\Delta T$. Then, the electronic device can keep normal operation when taking the calculated temperature as the temperature of the cell.

24 Claims, 11 Drawing Sheets

(58) Field of Classification Search
CPC .......... H01M 10/48; H01M 2010/4271; Y02E 60/10; G01K 7/24
See application file for complete search history.

(56) References Cited

U.S. PATENT DOCUMENTS

| | | | |
|---|---|---|---|
| 2017/0104248 A1 | 4/2017 | Lim | |
| 2019/0033392 A1* | 1/2019 | Mitsuyama | ............ H01M 10/48 |
| 2019/0036178 A1* | 1/2019 | Karner | ................. G01R 31/396 |
| 2019/0386352 A1* | 12/2019 | Kim | ..................... H01M 50/20 |
| 2020/0067148 A1* | 2/2020 | Kim | ......................... G01K 7/22 |

FOREIGN PATENT DOCUMENTS

| | | |
|---|---|---|
| CN | 105633498 A | 6/2016 |
| CN | 106505258 A | 3/2017 |
| CN | 106816658 | 6/2017 |
| CN | 109449518 A | 3/2019 |

\* cited by examiner

ELECTRONIC DEVICE AND METHOD FOR OBTAINING A CORRECT BATTERY TEMPERATURE

CROSS-REFERENCE TO RELATED APPLICATIONS

This application claims priority to Chinese Patent Application No. 201910224018.2 filed on Mar. 22, 2019, the contents of which are incorporated by reference herein.

FIELD

The subject matter herein generally relates to batteries.

BACKGROUND

An electronic device (e.g., electric motorcycle, electric car, and mobile phone) has a rechargeable battery. The rechargeable battery includes at least one cell, and when temperature of the cell exceeds a predetermined temperature, other components inside the electronic device may be damaged. Thus, a Negative Temperature Coefficient (NTC) thermistor is used to detect the temperature of the cell, and the thermistor is on an adapter board of the battery. When the battery is discharging with a large current, the temperature detected by the NTC thermistor is higher than temperature of the overall cell. An alarm may be triggered and protective mechanism of the electronic device may be activated, which affects user experience. Therefore, there is a need to provide a method for applying a correction to the reading which is output by the thermistor to calculate an actual temperature of the cell.

SUMMARY

What is needed, is a temperature correcting method, an electronic device, and a non-transitory storage medium. The method can reduce false alarms and false shutdowns of the electronic device.

The method for correcting temperature of the battery includes: detecting temperature T of the adapter board by a sensor; dividing a charging or discharging process of the rechargeable battery according to a predetermined time period; calculating a delta T value $\Delta T_i$ between the cell and the adapter board according to a relational model after the rechargeable battery is charging or discharging for the predetermined time period; calculating an temperature correction value $\Delta T$ by accumulating the delta T value $\Delta T_i$; calculating a temperature value $T_{cell}$ of the cell through the detected temperature T minus the temperature correction value $\Delta T$, wherein, $T_{cell}=T-\Delta T$; and equating the temperature value $T_{cell}$ as an overall temperature of the rechargeable battery.

The electronic device includes: a rechargeable battery which comprises a cell and an adapter board; a storage device; at least one processor; and the storage device further storing one or more programs that, when executed by the processor, cause the processor to: detect temperature T of the adapter board by a sensor; divide a charging or discharging process of the rechargeable battery according to a predetermined time period; calculate a delta T value $\Delta T_i$ between the cell and the adapter board according to a relational model after the rechargeable battery is charging or discharging for the predetermined time period; calculate a temperature correction value $\Delta T$ by accumulating the delta T value $\Delta T_i$; calculate a temperature value $T_{cell}$ of the cell by the detected temperature T minus the temperature correction value $\Delta T$, wherein, $T_{cell}=T-\Delta T$; and equate the temperature value $T_{cell}$ as an overall temperature of the rechargeable battery.

the non-transitory storage medium having stored thereon instructions that, when executed by a processor of an electronic device, causes the processor to perform a temperature correcting method, the electronic device includes a rechargeable battery, and the rechargeable battery includes a cell and an adapter board, the method includes: detecting temperature T of the adapter board by a sensor; dividing a charging or discharging process of the rechargeable battery according to a predetermined time period; calculating a delta T value $\Delta T_i$ between the cell and the adapter board according to a relational model after the rechargeable battery is charging or discharging for the predetermined time period; calculating a temperature correction value $\Delta T$ by accumulating the delta T value $\Delta T_i$; calculating a temperature value $T_{cell}$ of the cell through the detected temperature T minus the temperature correction value $\Delta T$, wherein, $T_{cell}=T-\Delta T$; and equating the temperature value $T_{cell}$ as an overall temperature of the rechargeable battery.

The temperature correcting method can calculate a temperature value of a cell through a detected temperature minus a temperature correction value. The detected temperature is detected by a sensor located on an adapter board. The temperature correction value is accumulated by a delta T value between the cell and the adapter board according to a relational model after the rechargeable battery is charging or discharging for a predetermined time period. The method can compensate the detected temperature, and reduce false alarms and false shutdowns of the electronic device.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
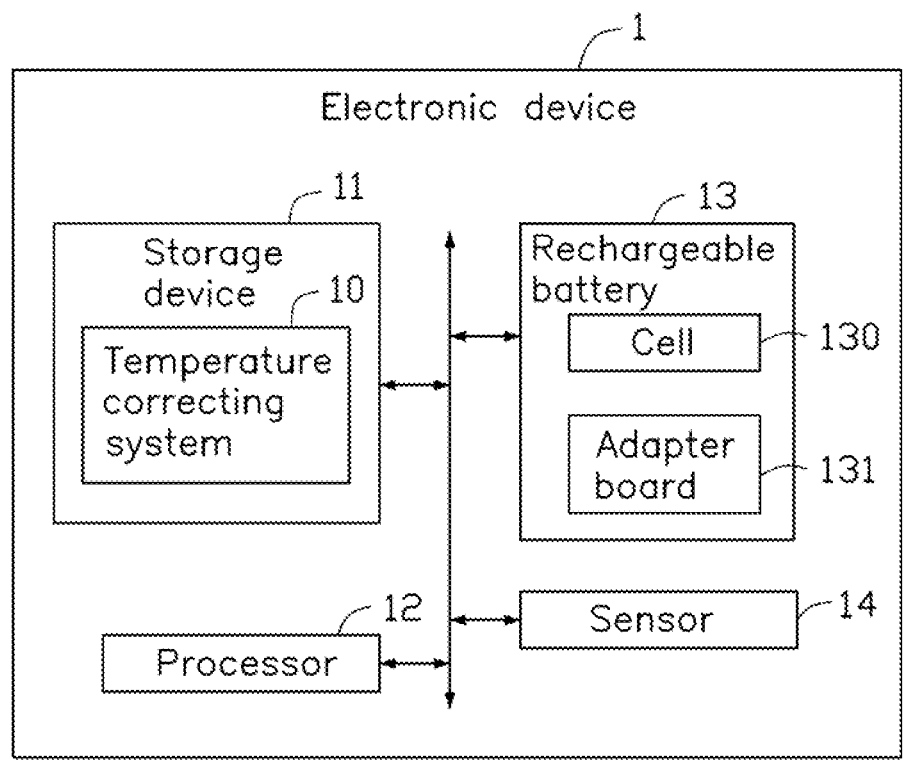
FIG. 1 is a block diagram of an embodiment of an electronic device including a temperature correcting system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, referencing the accompanying drawings, is illustrated by way of examples and not by way of limitation. It should be noted that references to "an" or "one" embodiment in this disclosure are not necessarily to the same embodiment, and such references mean "at least one."

Furthermore, the term "module", as used herein, refers to logic embodied in hardware or firmware, or to a collection of software instructions, written in a programming language, such as Java, C, or assembly. One or more software instructions in the modules can be embedded in firmware, such as in an EPROM. The modules described herein can be implemented as either software and/or hardware modules and can be stored in any type of non-transitory computer-readable medium or other storage device. Some non-limiting examples of non-transitory computer-readable media include CDs, DVDs, BLU-RAY, flash memory, and hard disk drives.

FIG. 1 illustrates an exemplary embodiment of an electronic device (electronic device 1). The electronic device 1 includes at least one rechargeable battery 13. In an exemplary embodiment, a temperature correcting system 10 is applied to the electronic device 1. In at least one exemplary embodiment, the electronic device 1 can further include, but is not limited to, a storage device 11, at least one processor 12, and a sensor 14.

FIG. 1 illustrates only one example of the electronic device 1, other examples can comprise more or fewer components that those shown in the embodiment, or have a different configuration of the various components. The electronic device 1 can be, but is not limited to, an electric motorcycle, an electric bicycle, an electric car, a mobile phone, a tablet computer, a personal digital assistant (PDA), a personal computer, or any other suitable electronic device.

In at least one exemplary embodiment, the rechargeable battery 13 can supply electrical energy to the electronic device 1. For example, the rechargeable battery 13 can be, but is not limited to, a lead-acid battery, a nickel-cadmium battery, a nickel-hydrogen battery, a lithium-ion battery, a lithium polymer battery, and a lithium iron phosphate battery. The rechargeable battery 13 is logically coupled to the processor 12 via a power management system. The power management system can enable functions such as charging, discharging, and power management for the electronic device 1. The rechargeable battery 13 includes a cell 130 and an adapter board 131.

In at least one exemplary embodiment, the sensor 14 is located on the adapter board 131 at a tab position. The sensor 14 can sense temperature of the adapter board 131 during charging or discharging of the rechargeable battery 13. In one embodiment, the sensor 14 can be a Negative temperature Coefficient (NTC) thermistor. It will be appreciated that the electronic device 1 may also include other sensors such as pressure sensors, light sensors, gyroscopes, hygrometers, infrared sensors, and the like.

In at least one exemplary embodiment, the electronic device 1 may further include other components such as a WI-FI unit, a BLUETOOTH unit, a speaker, and the like.

In at least one exemplary embodiment, the storage device 11 can be an internal storage device, such as a flash memory, a random access memory (RAM) for temporary storage of parameters, and/or a read-only memory (ROM) for permanent storage of parameters. The storage device 11 can also be an external storage device, such as an external hard disk, a storage card, or a data storage medium. The at least one processor 12 can be a central processing unit (CPU), a microprocessor, or other data processor chip that performs functions of the electronic device 1.

In at least one exemplary embodiment, the temperature correcting system 10 can correct a temperature of the rechargeable battery 13 by taking/equating a calculated temperature value $T_{cell}$ as an overall temperature of the rechargeable battery 13, and can determine if the rechargeable battery 13 is overheating by comparing the temperature value $T_{cell}$ with a preset temperature. When the temperature value $T_{cell}$ is greater than or equal to the preset temperature, it is determined that the rechargeable battery 13 is overheating. When the temperature value $T_{cell}$ is less than the preset temperature, it is determined that the rechargeable battery 13 is not overheating.

Figure 8:
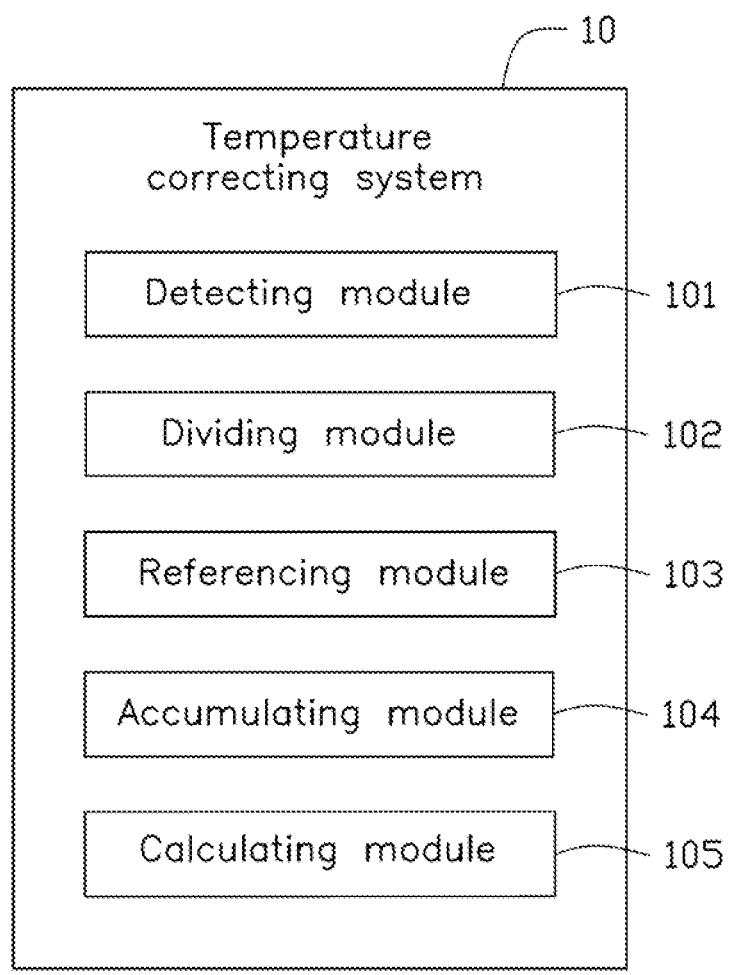
FIG. 8 is a block diagram of one embodiment of modules of a temperature correcting system in the device of FIG. 1.

In at least one exemplary embodiment, the temperature correcting system 10 as shown in FIG. 8 can include, but is not limited to, a detecting module 101, a dividing module 102, a referencing module 103, an accumulating module 104, and a calculating module 105. The modules 101-105 can comprise computerized instructions in the form of one or more computer-readable programs that can be stored in a non-transitory computer-readable medium, for example in the storage device 11, and executed by the processor 12 of the electronic device 1. Functions of the modules 101-105 are described with reference to FIG. 2.

Figure 2:
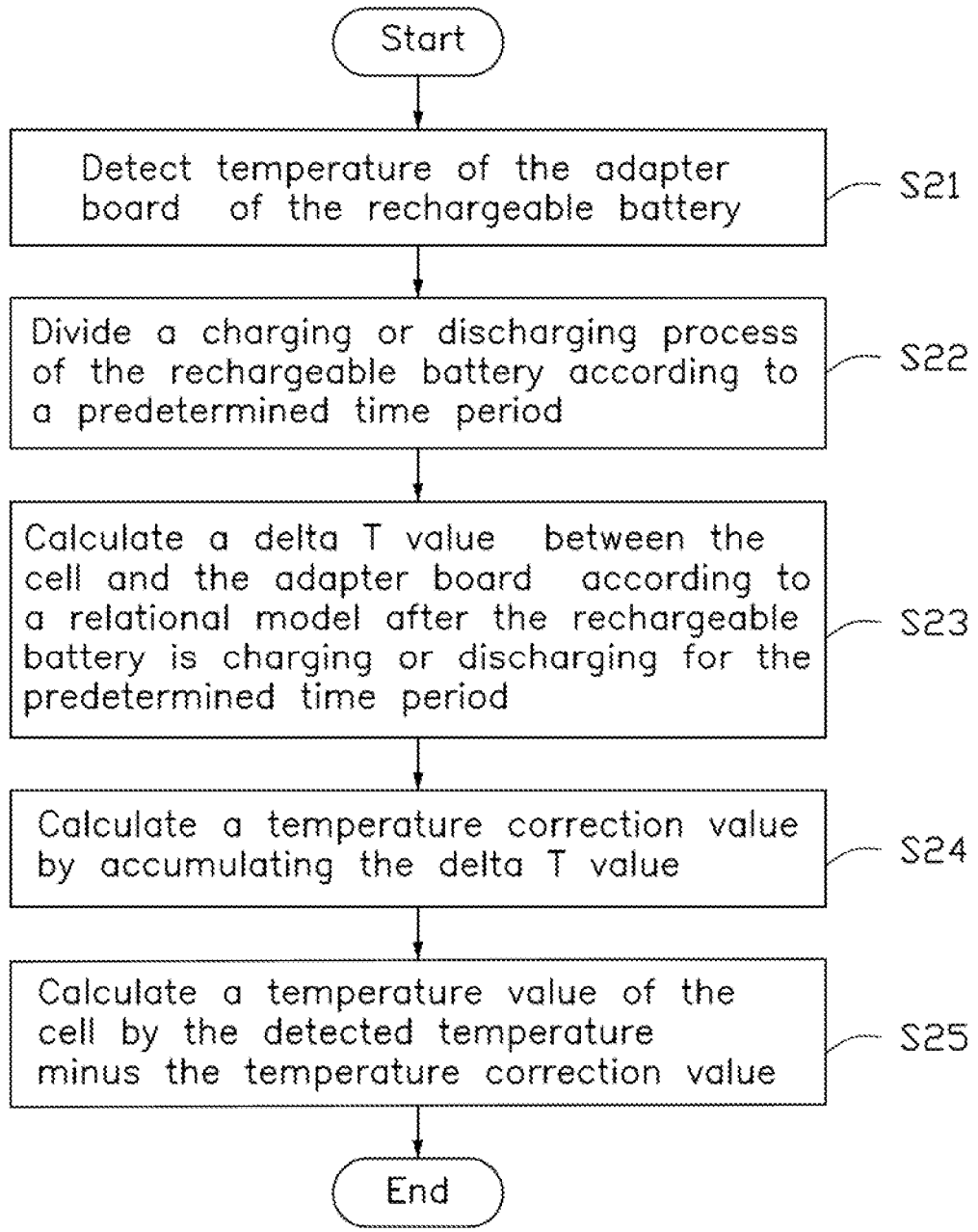
FIG. 2 is a flowchart of an embodiment of a method for correcting temperature.

FIG. 2 illustrates a flowchart of a method for correcting the sensed temperature of the rechargeable battery. In an example embodiment, the method is performed by execution of computer-readable software program codes or instructions by the at least one processor 12 of the electronic device 1.

Referring to FIG. 2, the method is provided by way of example, as there are a variety of ways to carry out the method. The method described below can be carried out using the configurations illustrated in FIG. 1, for example, and various elements of these figures are referenced in explaining method. Each block shown in FIG. 2 represents one or more processes, methods, or subroutines, carried out in the method. Furthermore, the illustrated order of blocks is illustrative only and the order of the blocks can be changed. Additional blocks can be added or fewer blocks can be utilized without departing from this disclosure. The example method can begin at block S21.

At block S21, the detecting module 101 can detect temperature T of the adapter board 131 of the rechargeable battery 13.

In at least one exemplary embodiment, when the rechargeable battery 13 is charging or discharging, the sensor 14 can detect the temperature of the adapter board 131 of the rechargeable battery 13.

In prior art, the temperature of the adapter board 131 of the rechargeable battery 13 that is detected by the detecting module 210 can be treated as a current temperature of the cell 130. However, the adapter board 131 is usually soldered with a tab and a metal oxide semiconductor (MOS) tube. When the rechargeable battery 13 is charged or discharged at a large current, the heat generated by the tab and the MOS tube is large, and the temperature of the adapter board 131 can be affected by the generated heat. The temperature of the adapter board 131 will be much higher than the actual temperature of cell 130. Thus, an alarm and protective mechanism of the electronic device 1 can be triggered needlessly.

For example, when the electronic device 1 is a mobile phone and the mobile phone is discharging. The cell 130 of the mobile phone can withstand a maximum temperature of 60 degrees Celsius. When the detected temperature of the adapter board 131 is 61 degrees Celsius, the actual temperature of the cell 130 may be 55 degrees Celsius. As the detected temperature is higher than the maximum temperature of the cell 130, the mobile phone may trigger a protective mechanism for forced shutdown, thereby stopping the discharge of the rechargeable battery 13. Therefore, when the temperature of the cell 130 is lower than the maximum temperature, the mobile phone may be forced to shutdown, which brings a bad experience to the user. In the disclosure, the detected temperature of the adapter board 131 can be corrected, and false alarms and false shutdowns of the electronic device 1 can be reduced when taking the corrected temperature as the temperature of the cell 130, which improves user experience.

At block S22, the dividing module 102 can divide the charging or discharging process of the rechargeable battery 13 according to a predetermined time period.

In at least one exemplary embodiment, in order to accurately calculate a temperature difference needing to be corrected during the charging or discharging process, the dividing module 102 can divide the charging or discharging process of the rechargeable battery 13 according to a predetermined time period. Then, the calculating module 105 can calculate the delta T value that the rechargeable battery 13 needs to be corrected after charging each predetermined time period, or can calculate the delta T value that the rechargeable battery 13 needs to be corrected after discharging each predetermined time period. Preferably, the predetermined time period may be one minute. For example, when the rechargeable battery 13 is discharging for one hour, the dividing module 102 can divide the discharging process of the rechargeable battery 13 according to one minute, and 60 minutes can be calculated.

At block S23, the referencing module 103 can calculate a delta T value $\Delta T_i$ between the cell 130 and the adapter board 131 according to a relational model after charging or discharging the battery 13 for the predetermined time period.

In at least one exemplary embodiment, the delta T value may be calculated by:

collecting a state of charge (SOC) and current of the rechargeable battery 13 after charging or discharging for a predetermined time period;

acquiring a rate of change of the delta T value between the cell 130 and the adapter board 131 from the relational model which is established in advance, according to the SOC and the current;

calculating the delta T value according to a product of the rate of change of the delta T value and the predetermined time period.

In at least one exemplary embodiment, the current of the rechargeable battery 13 is an average current after the rechargeable battery 13 is charging or discharging for the predetermined time period.

In at least one exemplary embodiment, the referencing module 103 can acquire the rate of change of the delta T value between the cell 130 and the adapter board 131 from the relational model by linear interpolation.

In at least one exemplary embodiment, the relational model describes a relationship between the rate of change of the delta T value between the cell 130 and the adapter board 131, the SOC, and the current. The temperature of the cell 130, the temperature of the adapter board 131, and the SOC are detected by the detecting module 101 when the battery 13 is charging or discharging with different currents.

In at least one exemplary embodiment, the relational model is established by:

detecting the temperature of the cell 130 and the temperature of the adapter board 131 when the rechargeable battery 13 is charging or discharging with different currents;

calculating the delta T value between the temperature of the cell 130 and the temperature of the adapter board 131;

determining the rate of change of the delta T value by analyzing the delta T value and state of charge (SOC) with different currents;

establishing the relational model according to the rate of change of the delta T value, the SOC, and the current.

In at least one exemplary embodiment, the referencing module 103 can establish the relational model between the rate of change of the delta T value, the SOC, and the current by a regression analysis. The regression analysis is applied to the delta T value, the SOC, and the current. Firstly, the referencing module 103 establishes a curve of the delta T value and the SOC while the rechargeable battery 13 is charging or discharging. Then the referencing module 103 obtains a relationship among the rate of change of the delta T value, the SOC, and the current by taking a derivation from the curve. Finally, the referencing module 103 can calculate the relational model by data fitting the relationship between the rate of change of the delta T value, the SOC, and the current.

At block S24, the accumulating module 104 can calculate a temperature correction value $\Delta T$ by accumulating the delta T value $\Delta T_i$.

In at least one exemplary embodiment, since the charging or discharging of the rechargeable battery 13 is a cumulative process, the accumulating module 104 can calculate the delta T value for each predetermined time period, and accumulate the calculated delta T value to calculate the temperature correction value $\Delta T$, wherein $$\Delta T = \sum_{i=1}^{N} \Delta T_i,$$

and N is a positive integer. For example, when the rechargeable battery 13 is discharging for one hour, the dividing module 103 can divide the discharging process into 60 parts, each part being one minute. The accumulating module 104 can calculate the temperature correction value by accumulating the delta T value of each of such parts. The accumulated temperature correction value is calculated according to formula:

$$\Delta T = \sum_{i=1}^{N=60} \Delta T_i.$$

In at least one exemplary embodiment, the method for correcting temperature further includes a step for correcting the temperature correction value.

In at least one exemplary embodiment, the accumulating module 104 can compare the temperature correction value with an upper threshold for correcting the temperature correction value, and compare the temperature correction value with a lower threshold. The accumulating module 104 determines whether the temperature correction value is greater than or equal to the upper threshold, and sets temperature correction value equal to the upper threshold when the temperature correction value is determined to greater than or equal to the upper threshold. The accumulating module 104 determines whether the temperature correction value is less than or equal to the lower threshold when the temperature correction value is less than the lower threshold, and sets the temperature correction value equal to the lower threshold when the temperature correction value is determined to less than or equal to the lower threshold.

It can be understood that when the temperature correction value is between the upper threshold and the lower threshold, the temperature correction value does not need to be corrected.

In at least one exemplary embodiment, the upper threshold is between 4 degrees and 8 degrees Celsius. Preferably, the upper threshold is 6 degrees Celsius.

In at least one exemplary embodiment, the lower threshold is between −2 degrees and 2 degrees Celsius. Preferably, the lower threshold is zero Celsius.

At block S25, the calculating module 105 can calculate a temperature value $T_{cell}$ of the cell 130 through the detected temperature T minus the accumulated temperature correction value $\Delta T$, and $T_{cell}=T-\Delta T$.

In at least one exemplary embodiment, the temperature of the cell 130 is equal to the detected temperature minus the accumulated temperature correction value. That is, the calculating module 105 can equate the temperature value $T_{cell}$ as an overall temperature of the rechargeable battery 13. Then the calculating module 105 can adjust the detected temperature to calculate an actual and correct temperature of the cell 130, and false alarms and false shutdowns of the electronic device 1 can be reduced after adjusting the detected temperature.

Figure 3A:
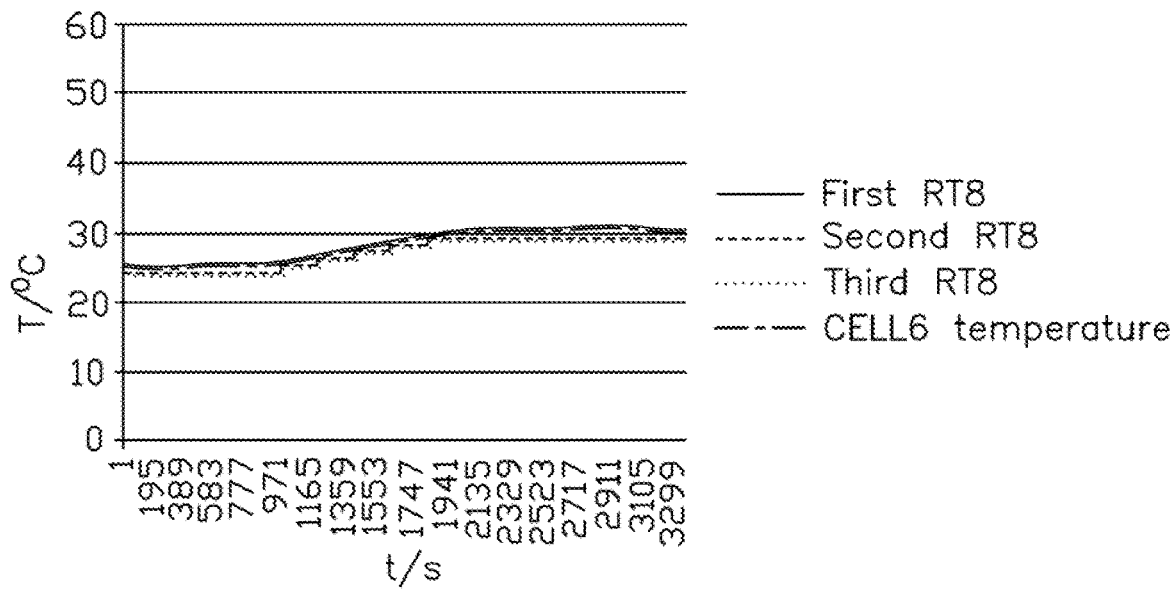
FIG. 3A illustrates a schematic diagram of a result after applying correction to the detected temperature of the cell when the rechargeable battery is charging with 10 A current and temperature of environment is 25 degrees Celsius, and an adapter board of the battery is close to MOS tube.
Figure 3B:
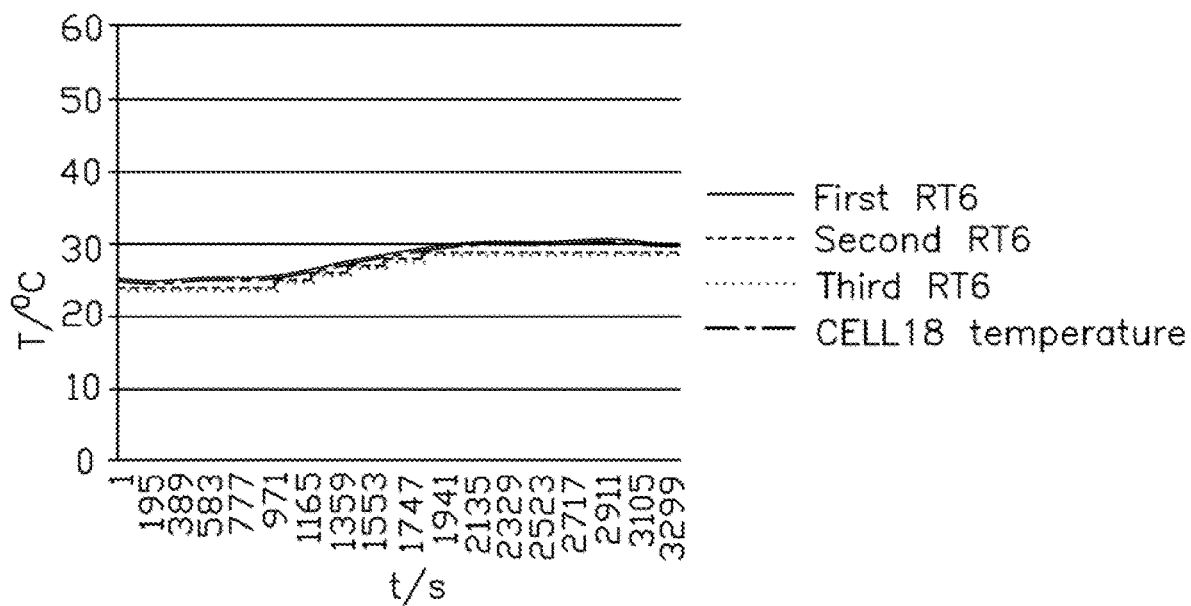
FIG. 3B illustrates a schematic diagram of a result after applying correction to the detected temperature of the cell when the rechargeable battery is charging with 10 A current and temperature of environment is 25 degrees Celsius, and the adapter board of the battery is away from the MOS tube.

FIGS. 3A-3B illustrate correction of the detected temperature of the cell 130 when the rechargeable battery 13 is charging with 10 A current and temperature of environment is 25 degrees Celsius. A first RT8 is an actual temperature of the adapter board 131, and the adapter board 131 is close to the MOS tube. The actual temperature of the adapter board 131 is calculated by a temperature recorder and the temperature recorder detects temperature of a thermocouple wire when the rechargeable battery 13 is charging. The thermocouple wire is bonded to the adapter board 131. A second RT8 is a detected temperature of the adapter board 131 from the BMS, and the adapter board 131 is close to the MOS tube. The sensor 14 can detect the temperature, and send the detected temperature to the BMS. Then the BMS can record the detected temperature. The sensor 14 is located on the adapter board 131 which is close to the MOS tube. A third RT8 is a temperature of the cell 130, which is calculated by applying correction to the second RT8. A CELL6 temperature is the actual temperature of the cell 130. The actual temperature of the cell 130 is calculated by a temperature recorder and the temperature recorder detects temperature of the thermocouple wire when the rechargeable battery 13 is charging. The thermocouple wire is bonded to the cell 130. As can be seen from FIG. 3A, near the MOS tube, the actual temperature of the adapter board 131, the detected temperature of the adapter board 131, and the temperature of the cell 130 are substantially consistent with the actual temperature of the cell 130. Therefore, during charging of the rechargeable battery 13 with a small current of 10 A, there is no substantial difference in temperature between the cell 130 and the adapter board 131 near the MOS tube.

FIG. 3B illustrates correction of the detected temperature of the cell 130 when the rechargeable battery 13 is charging with 10 A current and temperature of environment is 25 degrees Celsius. A first RT6 is an actual temperature of the adapter board 131, and the adapter board 131 is away from the MOS tube. The actual temperature of the adapter board 131 is calculated by a temperature recorder and the temperature recorder detects temperature of a thermocouple wire when the rechargeable battery 13 is charging. The thermocouple wire is bonded to the adapter board 131. A second RT6 is a detected temperature of the adapter board 131 from the BMS, and the adapter board 131 is away from the MOS tube. The sensor 14 can detect the temperature, and send the detected temperature to the BMS. Then the BMS can record the detected temperature. The sensor 14 is located on the adapter board 131 which is away from the MOS tube. A third RT6 is a temperature of the cell 130, which is calculated by applying correction to the second RT6. A CELL18 temperature is the actual temperature of the cell 130. The actual temperature of the cell 130 is calculated by a temperature recorder and the temperature recorder detects temperature of a thermocouple wire when the rechargeable battery 13 is charging. The thermocouple wire is bonded to the cell 130. As can be seen from FIG. 3B, away from the MOS tube, the actual temperature of the adapter board 131, the detected temperature of the adapter board 131, and the temperature of the cell 130 are largely consistent with the actual temperature of the cell 130. Therefore, during charging of the rechargeable battery 13 with a small current of 10 A, there is no substantial temperature difference between the cell 130 and the adapter board 131 away from the MOS tube.

As can be seen from FIGS. 3A-3B, during charging of the rechargeable battery 13 with a small current, there is no substantial temperature difference between the cell 130 and the adapter board 131 and no compensation to the detected temperature is required.

It should be noted that, the RT8 is a first position where the sensor 14 is bonded to the adapter board 131. The CELL6 is a first cell corresponding to the first position. The RT6 is a second position where the sensor 14 may be bonded to the adapter board 131. The CELL18 is a second cell corresponding to the second bonding position. The RT8, RT6, CELL6, and CELL18 in the following are the same as those shown in FIGS. 3A-3B, and will not be described below.

Figure 4A:
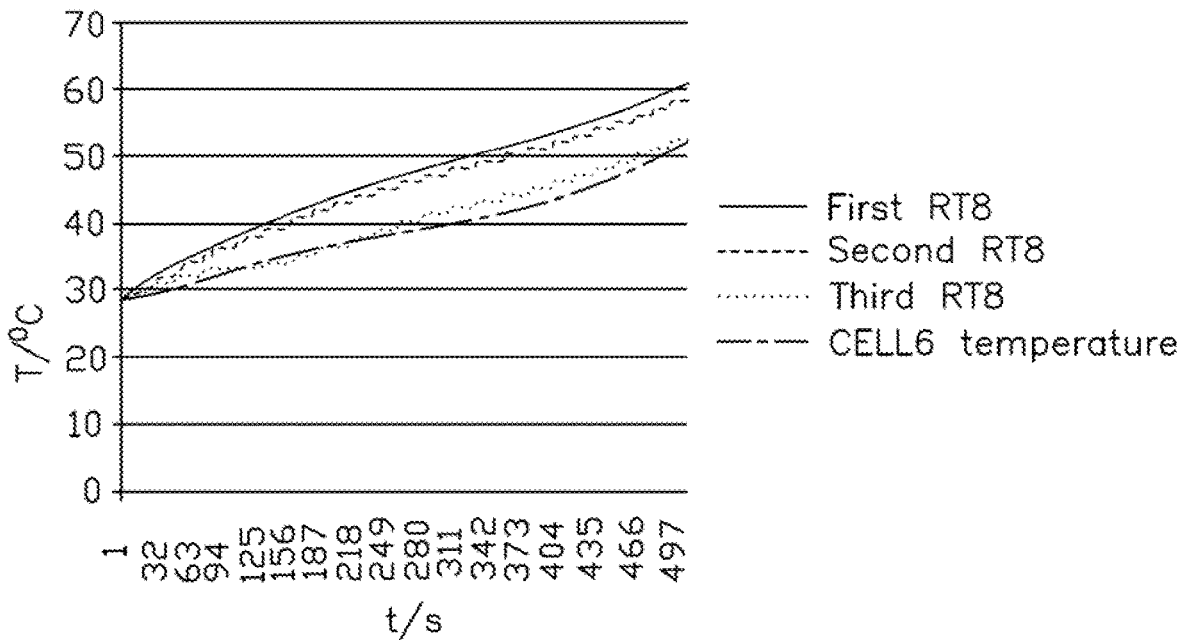
FIG. 4A illustrates a schematic diagram of a result after applying correction to the detected temperature of the cell when the rechargeable battery is discharging with 62 A current and temperature of environment is 25 degrees Celsius, and the adapter board of the battery is close to the MOS tube.
Figure 4B:
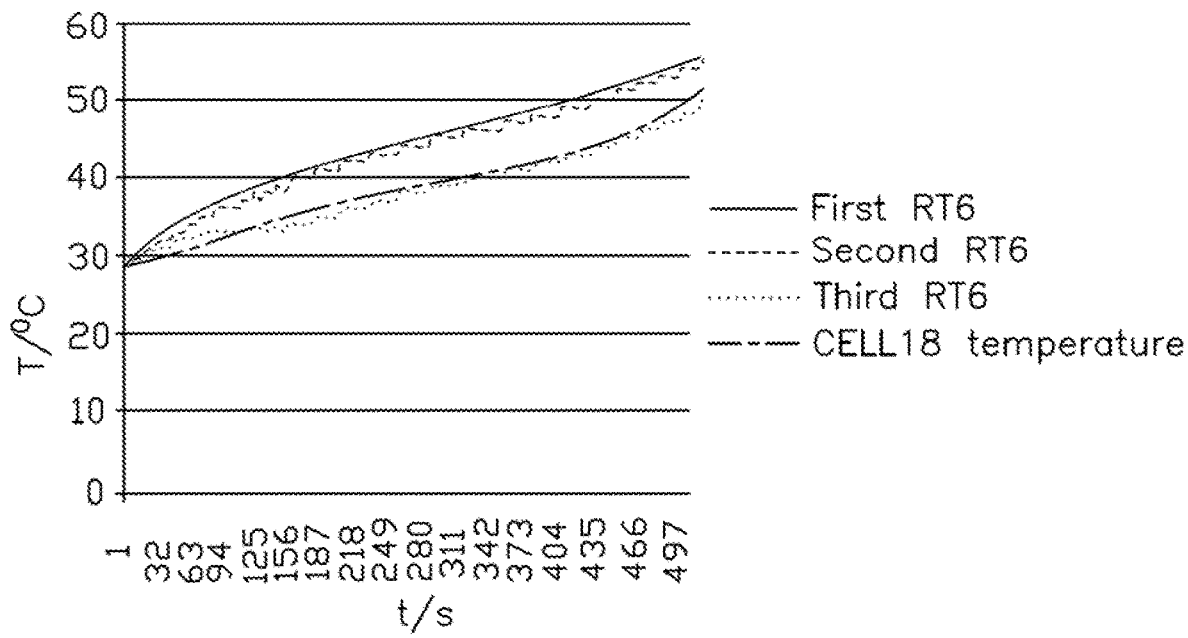
FIG. 4B illustrates a schematic diagram of a result after applying correction to the detected temperature of the cell when the rechargeable battery is discharging with 62 A current and temperature of environment is 25 degrees Celsius, and the adapter board of the battery is away from the MOS tube.

FIG. 4A-4B illustrate correction of the detected temperature of the cell 130 when the rechargeable battery 13 is discharging with 62 A current and temperature of environment is 25 degrees Celsius. As shown in FIG. 4A, a first RT8 is an actual temperature of the adapter board 131, and the adapter board 131 is close to the MOS tube. The actual temperature of the adapter board 131 is calculated by a temperature recorder and the temperature recorder detects temperature of a thermocouple wire when the rechargeable battery 13 is charging. The thermocouple wire is bonded to the adapter board 131. A second RT8 is a detected temperature of the adapter board 131 from the BMS, and the adapter board 131 is close to the MOS tube. The sensor 14 can detect the temperature, and send the detected temperature to the BMS. Then the BMS can record the detected temperature. The sensor 14 is located on the adapter board 131 which is close to the MOS tube. A third RT8 is a temperature of the cell 130, which is calculated by applying correction to the second RT8. A CELL6 temperature is the actual temperature of the cell 130. The actual temperature of the cell 130 is calculated by a temperature recorder and the temperature recorder detects temperature of the thermocouple wire when the rechargeable battery 13 is discharging. The thermocouple wire is bonded to the cell 130. As can be seen from FIG. 4A, near the MOS tube, the actual temperature of the adapter board 131 shows no difference from the detected temperature of the adapter board 131. The temperature of the cell 130 is basically the same as the actual temperature of the cell 130. In other words, the temperature of the cell 130 after compensation applied by the temperature compensation method is substantially consistent with the actual temperature of the cell 130 measured by the thermocouple wire disposed on the cell. The accuracy of the method is thus proved.

As shown in FIG. 4B, a first RT6 is actual temperature of the adapter board 131, and the adapter board 131 is away from the MOS tube. The actual temperature of the adapter board 131 is calculated by a temperature recorder and the temperature recorder detects temperature of a thermocouple wire when the rechargeable battery 13 is discharging. The thermocouple wire is welded to the adapter board 131. A second RT6 is a detected temperature of the adapter board 131 from the BMS, and the adapter board 131 is away from the MOS tube. The sensor 14 can detect the temperature, and send the detected temperature to the BMS. Then the BMS can record the detected temperature. The sensor 14 is located on the adapter board 131 which is away from the MOS tube. A third RT6 is a temperature of the cell 130, which is calculated by correcting the second RT6. A CELL18 temperature is the actual temperature of the cell 130. The actual temperature of the cell 130 is calculated by a temperature recorder and the temperature recorder detects temperature of a thermocouple wire when the rechargeable battery 13 is discharging. The thermocouple wire is welded to the cell 130. As can be seen from FIG. 4B, away from the MOS tube, the actual temperature of the adapter board 131 is consistent with the detected temperature of the adapter board 131, and the temperature of the cell 130 is consistent with the actual temperature of the cell 130, which proves the accuracy of the method.

Meanwhile, comparing FIG. 4B with FIG. 4A, the detected temperature of the adapter board 131 recorded by the BMS near the MOS tube is higher than that of the remote MOS tube when the rechargeable battery 13 is discharging a large current. That is to say, the detected temperature of the adapter board 131 is affected by MOS tube.

FIG. 5A-5D illustrate correction of the detected temperature of the cell 130 when the rechargeable battery 13 is discharging with 62 A current and temperature of environment is 25 degrees Celsius. After the rechargeable battery 13 discharges half of its charge, the rechargeable battery 13 stands for two hours, and then the rechargeable battery 13 continues discharging at the 62 A current.

Figure 5A:
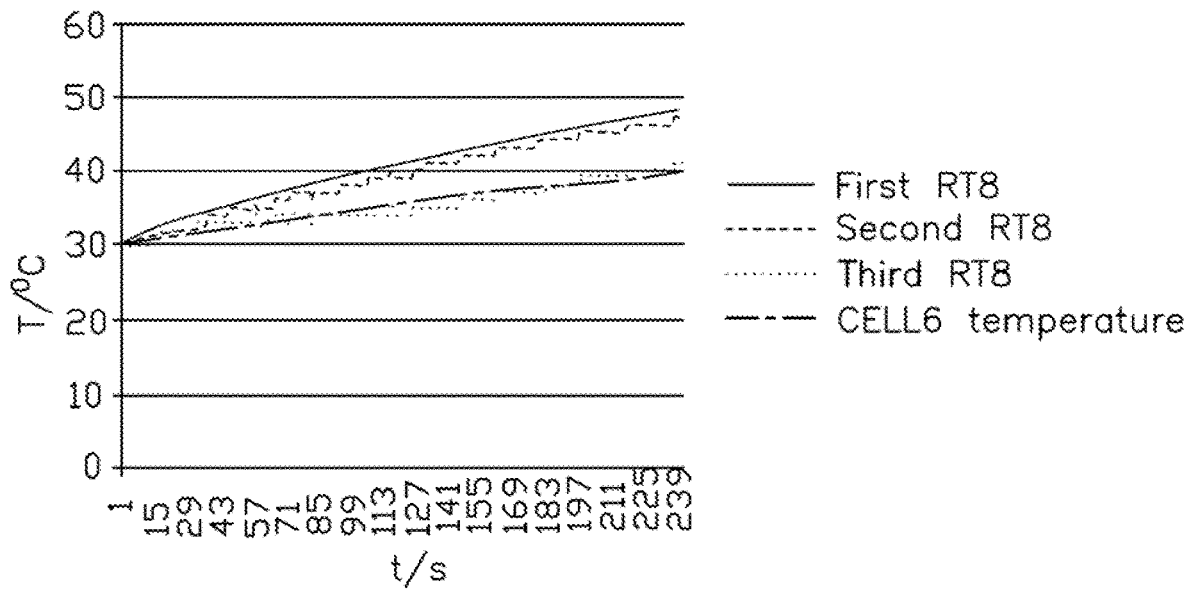
FIG. 5A illustrates a schematic diagram of a result after applying correction to the detected temperature of the cell when the battery is discharging with 62 A current until half of the electrical charge is spent and temperature of environment is 25 degrees Celsius, and the adapter board of the battery is close to the MOS tube.

The FIG. 5A illustrates correction of the detected temperature of the cell 130 when the rechargeable battery 13 is discharging with 62 A current until half of the electrical charge is spent and temperature of environment is 25 degrees Celsius. A first RT8 is an actual temperature of the adapter board 131, and the adapter board 131 is close to the MOS tube. The actual temperature of the adapter board 131 is calculated by a temperature recorder and the temperature recorder detects temperature of a thermocouple wire when the rechargeable battery 13 is discharging. The thermocouple wire is welded to the adapter board 131. A second RT8 is a detected temperature of the adapter board 131 from the BMS, and the adapter board 131 is close to the MOS tube. The sensor 14 can detect the temperature, and send the detected temperature to the BMS. Then the BMS can record the detected temperature. The sensor 14 is located on the adapter board 131 which is close to the MOS tube. A third RT8 is a temperature of the cell 130, which is calculated by correcting the second RT8. A CELL6 temperature is the actual temperature of the cell 130. The actual temperature of the cell 130 is calculated by a temperature recorder and the temperature recorder detects temperature of the thermocouple wire when the rechargeable battery 13 is discharging. The thermocouple wire is welded to the cell 130. As can be seen from FIG. 5A, near the MOS tube, the actual temperature of the adapter board 131 is higher than the detected temperature of the adapter board 131. The temperature of the cell 130 is basically the same as the actual temperature of the cell 130. In other words, the temperature of the cell 130 as compensated by the method of the present application is substantially consistent with the actual temperature of the cell 130 measured by the thermocouple wire disposed on the cell, which proves the accuracy of the method.

Figure 5B:
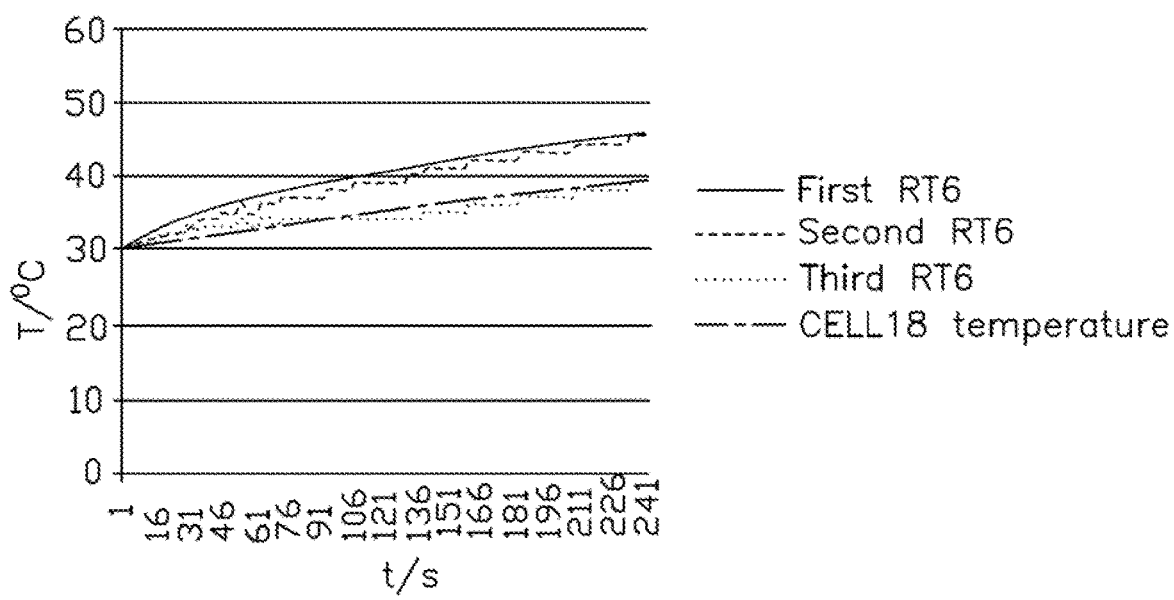
FIG. 5B illustrates a schematic diagram of a result after applying correction to the detected temperature of the cell when the battery is discharging with 62 A current until half of the electrical charge is spent and temperature of environment is 25 degrees Celsius, and the adapter board of the battery is away from the MOS tube.

FIG. 5B illustrates correction of the detected temperature of the cell 130 when the rechargeable battery 13 is discharging with 62 A current until half of the electrical charge is lost, and temperature of environment is 25 degrees Celsius. A first RT6 is an actual temperature of the adapter board 131, and the adapter board 131 is away from the MOS tube. The actual temperature of the adapter board 131 is calculated by a temperature recorder and the temperature recorder detects temperature of a thermocouple wire when the rechargeable battery 13 is discharging. The thermocouple wire is welded to the adapter board 131. A second RT6 is a detected temperature of the adapter board 131 from the BMS, and the adapter board 131 is away from the MOS tube. The sensor 14 can detect the temperature, and send the detected temperature to the BMS. Then the BMS can record the detected temperature. The sensor 14 is located on the adapter board 131 which is away from the MOS tube. A third RT6 is a temperature of the cell 130, which is calculated by correcting the second RT6. A CELL18 temperature is the actual temperature of the cell 130. The actual temperature of the cell 130 is calculated by a temperature recorder and the temperature recorder detects temperature of a thermocouple wire when the rechargeable battery 13 is discharging. The thermocouple wire is welded to the cell 130. As can be seen from FIG. 3B, away from the MOS tube, the actual temperature of the adapter board 131 is slightly higher than the detected temperature of the adapter board 131. There is an initial error between the temperature of the cell 130 and the actual temperature of the cell 130, but the error decreases when the rechargeable battery 13 is discharging with 62 A current until half of the electrical charge is lost.

Meanwhile, comparing FIG. 5B with FIG. 5A, the detected temperature of the adapter board 131 recorded by the BMS near the MOS tube is higher than that of the remote MOS tube when the rechargeable battery 13 is discharging a large current. That is to say, the detected temperature of the adapter board 131 is affected by MOS tube.

Figure 5C:
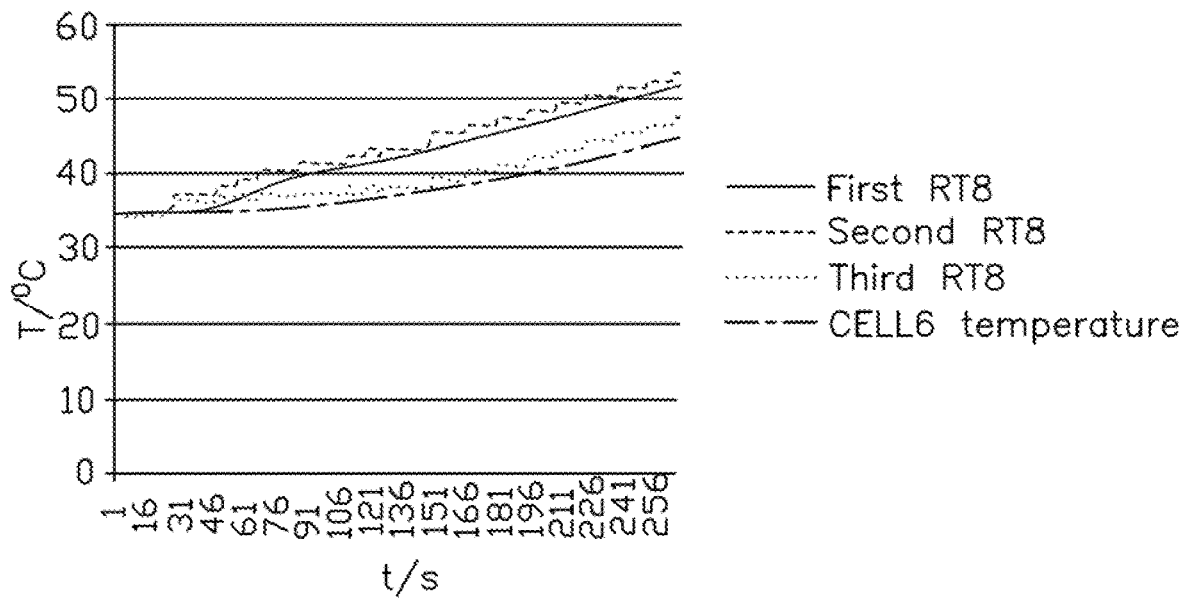
FIG. 5C illustrates a schematic diagram of a result after applying correction to the detected temperature of the cell when the rechargeable battery 13 is discharging with 62 A current and temperature of environment is 25 degrees Celsius, the rechargeable battery 13 being half-discharged and left to stand for two hours, then the discharging at 62 A current being continued, and the adapter board of the battery is close to the MOS tube.

The FIG. 5C illustrates correction of the detected temperature of the cell 130 after the rechargeable battery 13 is discharging at 62 A current and temperature of environment is 25 degrees Celsius. After the rechargeable battery 13 discharges half of the charge, the rechargeable battery 13 stands for two hours, and then the discharge by the rechargeable battery 13 is continued at the 62 A current until no electrical charge remains. A first RT8 is an actual temperature of the adapter board 131, and the adapter board 131 is close to the MOS tube. The actual temperature of the adapter board 131 is calculated by a temperature recorder and the temperature recorder detects temperature of a thermocouple wire when the rechargeable battery 13 is discharging. The thermocouple wire is welded to the adapter board 131. A second RT8 is a detected temperature of the adapter board 131 from the BMS, and the adapter board 131 is close to the MOS tube. The sensor 14 can detect the temperature, and send the detected temperature to the BMS. Then the BMS can record the detected temperature. The sensor 14 is located on the adapter board 131 which is close to the MOS tube. A third RT8 is a temperature of the cell 130, which is calculated by correcting the second RT8. A CELL6 temperature is the actual temperature of the cell 130. The actual temperature of the cell 130 is calculated by a temperature recorder and the temperature recorder detects temperature of the thermocouple wire when the rechargeable battery 13 is discharging. The thermocouple wire is welded to the cell 130. As can be seen from FIG. 5C, near the MOS tube, the actual temperature of the adapter board 131 is slightly higher than the detected temperature of the adapter board 131. The temperature of the cell 130 is also slightly higher than the actual temperature of the cell 130.

Figure 5D:
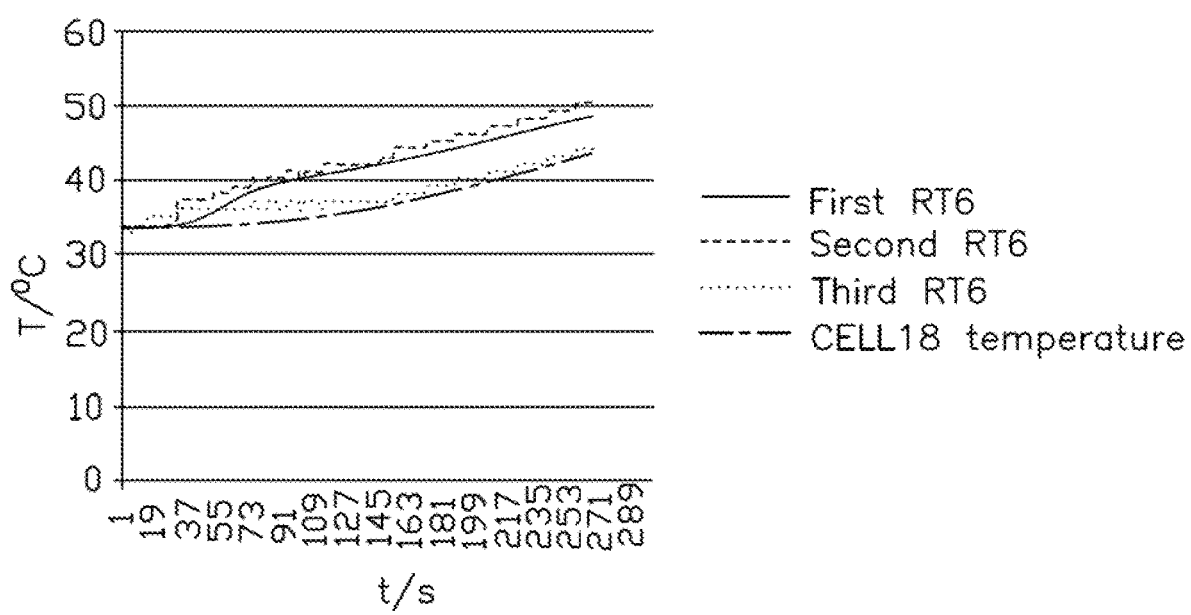
FIG. 5D illustrates a schematic diagram of a result after applying correction to the detected temperature of the cell when the rechargeable battery 13 is discharging with 62 A current and temperature of environment is 25 degrees Celsius, the rechargeable battery 13 being half-discharged and left to stand for two hours, then the discharging at 62 A current being continued, and the adapter board of the battery is away from the MOS tube.

FIG. 5D illustrates correction of the detected temperature of the cell 130 when the rechargeable battery 13 is discharging at 62 A current until loss of half of the electricity, and temperature of environment is 25 degrees Celsius. A first RT6 is an actual temperature of the adapter board 131, and the adapter board 131 is away from the MOS tube. The actual temperature of the adapter board 131 is calculated by a temperature recorder and the temperature recorder detects temperature of a thermocouple wire when the rechargeable battery 13 is discharging. The thermocouple wire is welded to the adapter board 131. A second RT6 is a detected temperature of the adapter board 131 from the BMS, and the adapter board 131 is away from the MOS tube. The sensor 14 can detect the temperature, and send the detected temperature to the BMS. Then the BMS can record the detected temperature. The sensor 14 is located on the adapter board 131 which is away from the MOS tube. A third RT6 is a temperature of the cell 130, which is calculated by correcting the second RT6. A CELL18 temperature is the actual temperature of the cell 130. The actual temperature of the cell 130 is calculated by a temperature recorder and the temperature recorder detects temperature of a thermocouple wire when the rechargeable battery 13 is discharging. The thermocouple wire is welded to the cell 130. As can be seen from FIG. 5D, away from the MOS tube, the actual temperature of the adapter board 131 is slightly higher than the detected temperature of the adapter board 131. There is an initial error between the temperature of the cell 130 and the actual temperature of the cell 130, the error decreasing when the rechargeable battery 13 is discharging with 62 A current until loss of half of the charge. In general, the CELL18 temperature is slightly higher than the third RT6.

Figure 6A:
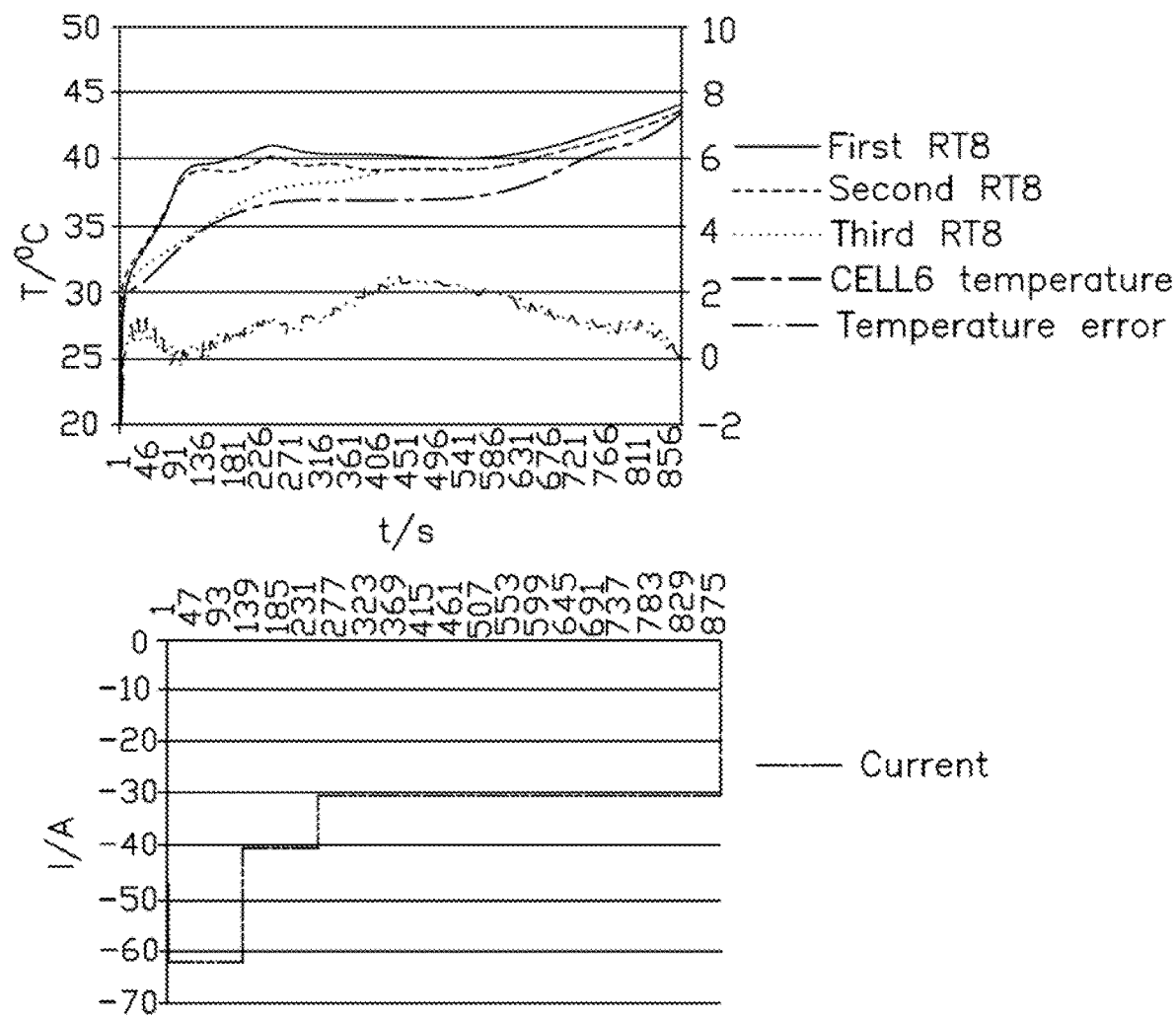
FIG. 6A illustrates a schematic diagram of a result after applying correction to the detected temperature of the cell when the rechargeable battery discharges with 62 A current for a predetermined first time period, discharged with 40 A current for a predetermined second time period, and discharged with 30 A current for a predetermined third time period, the temperature of environment being 25 degrees Celsius, and the adapter board of the battery is close to the MOS tube.
Figure 6B:
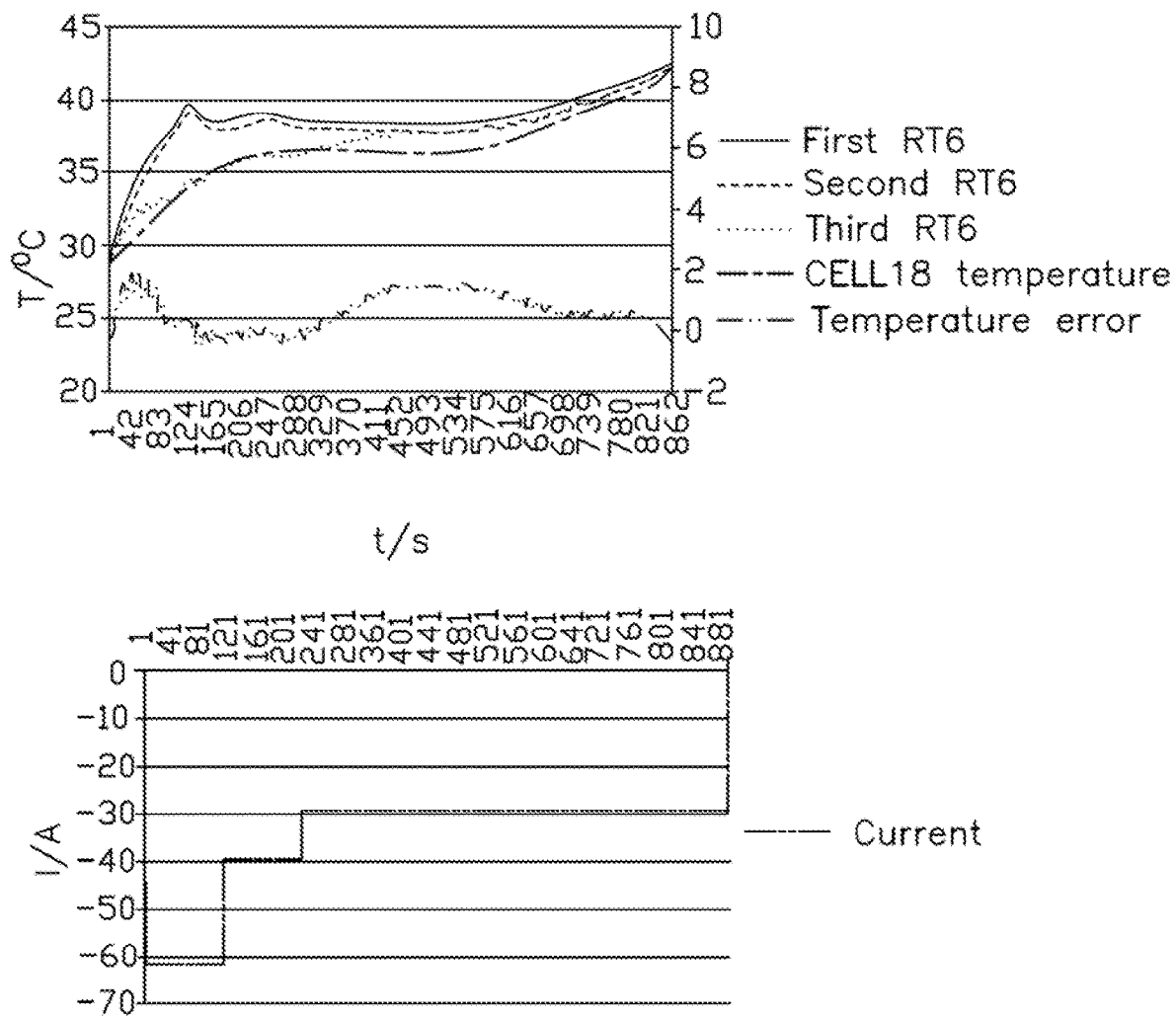
FIG. 6B illustrates a schematic diagram of a result after applying correction to the detected temperature of the cell when the rechargeable battery discharges with 62 A current for a predetermined first time period, discharged with 40 A current for a predetermined second time period, and discharged with 30 A current for a predetermined third time period, the temperature of environment being 25 degrees Celsius, and the adapter board of the battery is away from the MOS tube.

FIG. 6A-6B illustrate correction of the detected temperature of the cell 130 when the rechargeable battery 13 is discharging with 62 A current for a predetermined first time period, and is discharging with 40 A current for a predetermined second time period, and is discharging with 30 A current for a predetermined third time period, the temperature of environment is 25 degrees Celsius.

The abscissa in FIG. 6A indicates time, the left ordinate indicates temperature, and the right ordinate indicates a temperature difference or error. The delta T value or error is a difference between the corrected temperature of the cell 130 and the actual temperature of the cell 130 according to the temperature recorder. A first RT8 is an actual temperature of the adapter board 131, and the adapter board 131 is close to the MOS tube. The actual temperature of the adapter board 131 is calculated by a temperature recorder and the temperature recorder detects temperature of a thermocouple wire when the rechargeable battery 13 is discharging. The thermocouple wire is welded to the adapter board 131. A second RT8 is a detected temperature of the adapter board 131 from the BMS, and the adapter board 131 is close to the MOS tube. The sensor 14 can detect the temperature, and send the detected temperature to the BMS. Then the BMS can record the detected temperature. The sensor 14 is located on the adapter board 131 which is close to the MOS tube. A third RT8 is a temperature of the cell 130, which is calculated by correcting the second RT8 using the temperature correcting method of the present disclosure. A CELL6 temperature is the actual temperature of the cell 130. The actual temperature of the cell 130 is calculated by a temperature recorder and the temperature recorder detects temperature of the thermocouple wire when the rechargeable battery 13 is discharging. The thermocouple wire is welded to the cell 130. The temperature error is the difference between the corrected temperature of the cell 130 (e.g., the third RT8) and the actual temperature of the cell 130 (e.g., the CELL6 temperature) which is calculated by the temperature recorder, which reflects the accuracy of the temperature correcting method. As can be seen from FIG. 6A, near the MOS tube, the temperature error fluctuates between 0 degrees Celsius and 2.1 degrees Celsius.

The abscissa in FIG. 6B indicates time, the left ordinate indicates temperature, and the right ordinate indicates the temperature error. A first RT6 is an actual temperature of the adapter board 131, and the adapter board 131 is away from the MOS tube. The actual temperature of the adapter board 131 is calculated by a temperature recorder and the temperature recorder detects temperature of a thermocouple wire when the rechargeable battery 13 is discharging. The thermocouple wire is welded to the adapter board 131. A second RT6 is a detected temperature of the adapter board 131 from the BMS, and the adapter board 131 is away from the MOS tube. The sensor 14 can detect the temperature, and send the detected temperature to the BMS. Then the BMS can record the detected temperature. The sensor 14 is located on the adapter board 131 which is away from the MOS tube. A third RT6 is a temperature of the cell 130, which is calculated by correcting the second RT6. A CELL18 temperature is the actual temperature of the cell 130. The actual temperature of the cell 130 is calculated by a temperature recorder and the temperature recorder detects temperature of a thermocouple wire when the rechargeable battery 13 is discharging. The thermocouple wire is welded to the cell 130. The temperature error is the difference between the corrected temperature of the cell 130 (e.g., the third RT6) and the actual temperature of the cell 130 (e.g., the CELL18 temperature) which is calculated by the temperature recorder, which reflects the accuracy of the temperature correcting method. As can be seen from FIG. 6A, away from the MOS tube, the temperature error fluctuates between −0.2 degree Celsius and 2 degree Celsius.

Figure 7A:
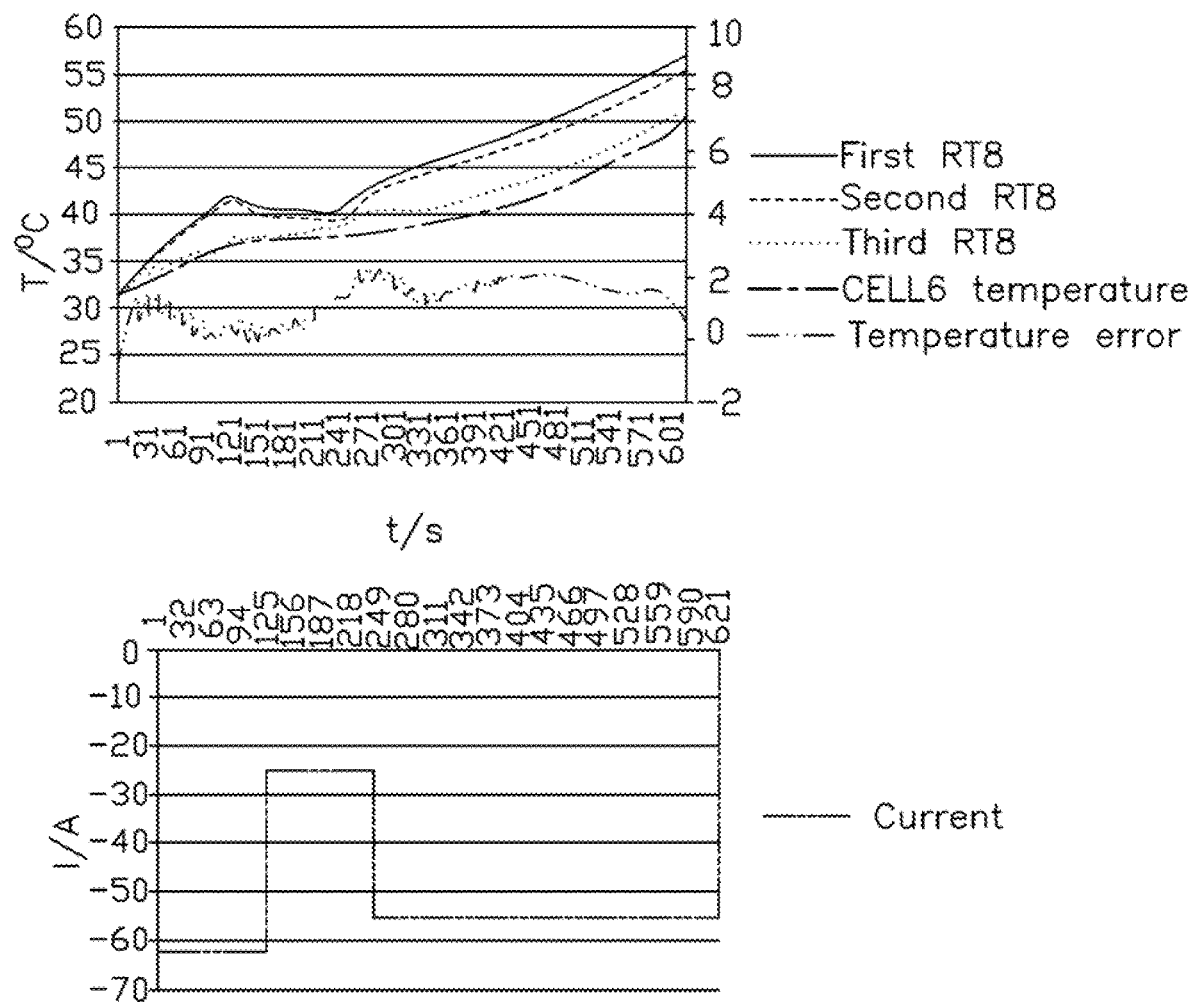
FIG. 7A illustrates a schematic diagram of a result after applying correction to the detected temperature of the cell when the rechargeable battery is discharged with 62 A current for the first time period, discharged with 25 A current for the second time period, and discharged with 55 A current for the third time period, the temperature of the environment being 25 degrees Celsius, and the adapter board of the battery is close to the MOS tube.
Figure 7B:
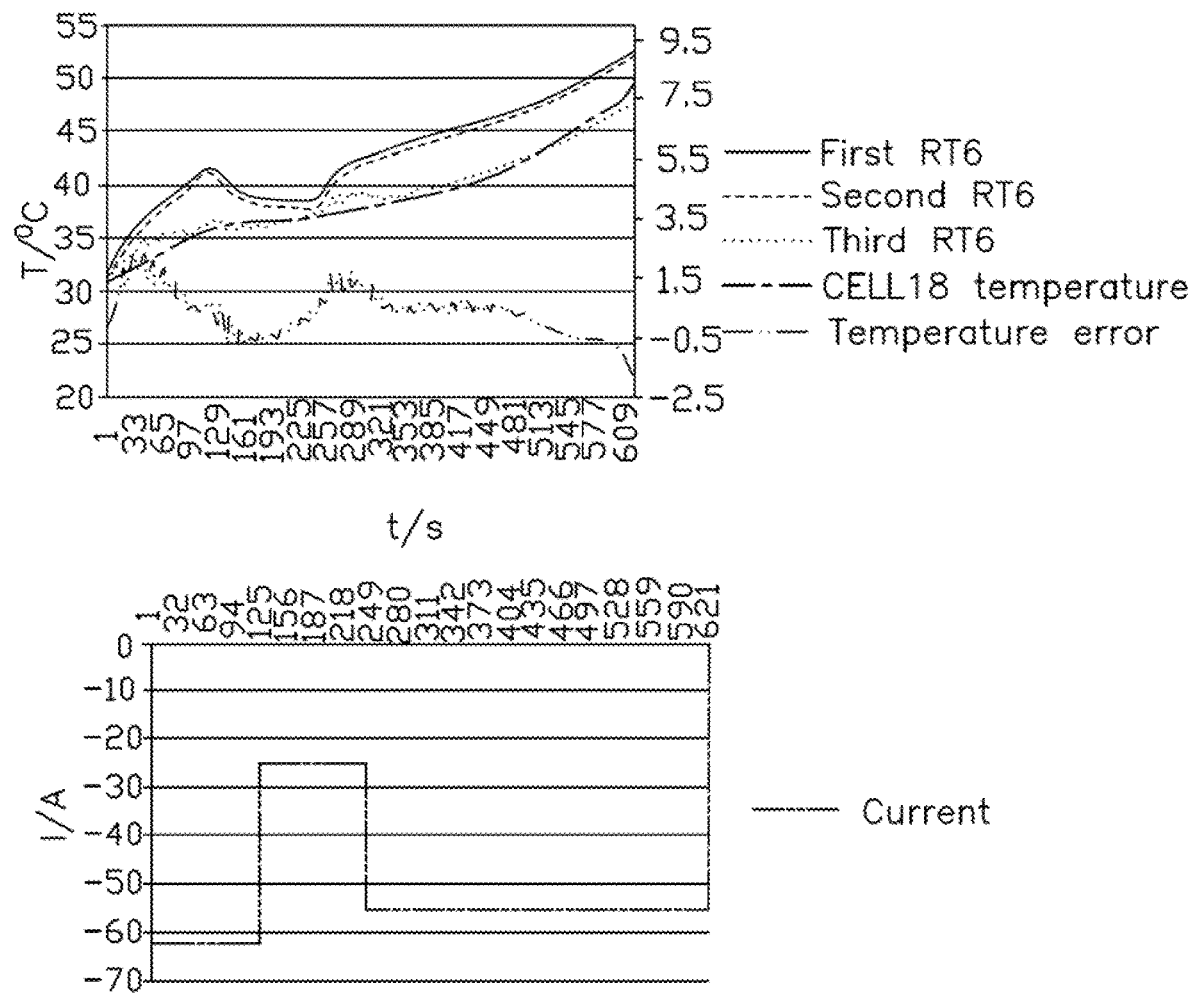
FIG. 7B illustrates a schematic diagram of a result after applying correction to the detected temperature of the cell when the rechargeable battery is discharged with 62 A current for the first time period, discharged with 25 A current for the second time period, and discharged with 55 A current for the third time period, the temperature of the environment being 25 degrees Celsius, and the adapter board of the battery is away from the MOS tube.

FIG. 7A-7B illustrate correction of the detected temperature of the cell 130 when the rechargeable battery 13 is discharging with 62 A current for a first time period, and is discharging with 25 A current for a second period time, and is discharging with 55 A current for a third period time, and the temperature of the environment is 25 degrees Celsius.

The abscissa in FIG. 7A indicates time, the left ordinate indicates temperature, and the right ordinate indicates a temperature error. The temperature error is a difference between the corrected temperature of the cell 130 and the actual temperature of the cell 130 which is calculated by the temperature recorder. A first RT8 is an actual temperature of the adapter board 131, and the adapter board 131 is close to the MOS tube. The actual temperature of the adapter board 131 is calculated by a temperature recorder and the temperature recorder detects temperature of a thermocouple wire when the rechargeable battery 13 is discharging. The thermocouple wire is welded to the adapter board 131. A second RT8 is a detected temperature of the adapter board 131 from the BMS, and the adapter board 131 is close to the MOS tube. The sensor 14 can detect the temperature, and send the detected temperature to the BMS. Then the BMS can record the detected temperature. The sensor 14 is located on the adapter board 131 which is close to the MOS tube. A third RT8 is a temperature of the cell 130, which is calculated by correcting the second RT8 using the temperature correcting method. A CELL6 temperature is the actual temperature of the cell 130. The actual temperature of the cell 130 is calculated by a temperature recorder and the temperature recorder detects temperature of the thermocouple wire when the rechargeable battery 13 is discharging. The thermocouple wire is welded to the cell 130. The temperature error is the difference between the corrected temperature of the cell 130 (e.g., the third RT8) and the actual temperature of the cell 130 (e.g., the CELL6 temperature) which is calculated by the temperature recorder, which reflects the accuracy of the method. As can be seen from FIG. 7A, near the MOS tube, the temperature error fluctuates between −0.5 degree Celsius and 2 degrees Celsius.

The abscissa in FIG. 7B indicates time, the left ordinate indicates temperature, and the right ordinate indicates the temperature error. A first RT6 is an actual temperature of the adapter board 131, and the adapter board 131 is away from the MOS tube. The actual temperature of the adapter board 131 is calculated by a temperature recorder and the temperature recorder detects temperature of a thermocouple wire when the rechargeable battery 13 is discharging. The thermocouple wire is welded to the adapter board 131. A second RT6 is a detected temperature of the adapter board 131 from the BMS, and the adapter board 131 is away from the MOS tube. The sensor 14 can detect the temperature, and send the detected temperature to the BMS. Then the BMS can record the detected temperature. The sensor 14 is located on the adapter board 131 which is away from the MOS tube. A third RT6 is a temperature of the cell 130, which is calculated by correcting the second RT6. A CELL18 temperature is the actual temperature of the cell 130. The actual temperature of the cell 130 is calculated by a temperature recorder and the temperature recorder detects temperature of a thermocouple wire when the rechargeable battery 13 is discharging. The thermocouple wire is welded to the cell 130. The temperature error is the difference between the corrected temperature of the cell 130 (e.g., the third RT6) and the actual temperature of the cell 130 (e.g., the CELL18 temperature) which is calculated by the temperature recorder, which reflects the accuracy of the temperature correcting method. As can be seen from FIG. 7B, away from the MOS tube, the temperature error fluctuates between −0.2 degree Celsius and 2 degrees Celsius.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. An electronic device comprising:
    a rechargeable battery which comprises a cell and an adapter board;
    a storage device;
    at least one processor; and
    the storage device further storing one or more programs that, when executed by the processor, cause the processor to:
        detect temperature T of the adapter board by a sensor;
        divide a charging or discharging process of the rechargeable battery into N predetermined time periods, N being a positive integer;
        calculate a delta T value $\Delta T_i$, between the cell and the adapter board according to a relational model after the rechargeable battery is charging or discharging for the i-th predetermined time period;
        calculate a temperature correction value $\Delta T$ by accumulating the delta T value $\Delta T_i$ of the i-th of the N predetermined time periods, wherein i=1 to N;
        calculate a temperature value $T_{Cell}$ of the cell by the detected temperature T minus the temperature correction value $\Delta T$, wherein, $T_{cell}$–T–$\Delta T$; and
        equate the temperature value $T_{Cell}$ as an overall temperature of the rechargeable battery.

2. The electronic device according to claim 1, wherein the processor is further caused to:
    determine whether the temperature correction value is greater than or equal to an upper threshold;
    set the temperature correction value equal to the upper threshold when the temperature correction value is greater than or equal to the upper threshold;
    determine whether the temperature correction value is less than or equal to a lower threshold when the temperature correction value is less than the upper threshold; and
    set the temperature correction value equal to the lower threshold when the temperature correction value is less than or equal to the lower threshold.

3. The electronic device according to claim 1, wherein the relational model describes a corresponding relationship among a rate of change of the delta T value, a state of charge (SOC) and a current.

4. The electronic device according to claim 3, wherein the processor is further caused to:
    collect the state of charge (SOC) and the current of the rechargeable battery after charging or discharging for a predetermined time period;
    acquire the rate of change of the delta T value between the cell and the adapter board from the relational model according to the state of charge (SOC) and the current; and
    calculate the delta T value according to a product of the rate of change of the delta T value and the predetermined time period.

5. The electronic device according to claim 4, wherein the current of the rechargeable battery is an average current after the rechargeable battery charging or discharging for the predetermined time period.

6. The electronic device according to claim 3, wherein the relational model is established by:
    detecting the temperature of the cell and the temperature of the adapter board when the rechargeable battery is charging or discharging with different currents;
    calculating the delta T value between the temperature of the cell and the temperature of the adapter board;
    determining the rate of change of the delta T value by the delta T value and state of charge (SOC) with different currents; and
    establishing the relational model according to the rate of change of the delta T value, the SOC, and the current.

7. The electronic device according to claim 6, wherein the relational model is established by regression analyzing the delta T value, the state of charge (SOC) and the current.

8. The electronic device according to claim 2, wherein the upper threshold is between 4 degrees Celsius and 8 degrees Celsius, and the lower threshold is between –2 degrees Celsius and 2 degrees Celsius.

9. A temperature correcting method applicable in an electronic device, the electronic device comprising a rechargeable battery, and the rechargeable battery comprising a cell and an adapter board, the method comprising:
    detecting temperature T of the adapter board by a sensor;
    dividing a charging or discharging process of the rechargeable battery into N predetermined time periods, N being a positive integer;
    calculating a delta T value $\Delta T_i$, between the cell and the adapter board according to a relational model after the rechargeable battery is charging or discharging for the i-th predetermined time period;
    calculating a temperature correction value $\Delta T$, by accumulating the delta T value $\Delta T_i$ of the i-th of the N predetermined time periods, wherein i=1 to N;
    calculating a temperature value $T_{Cell}$ of the cell through the detected temperature T minus the temperature correction value $\Delta T$, wherein, $T_{cell}$–T–$\Delta T$; and
    equating the temperature value $T_{Cell}$ as an overall temperature of the rechargeable battery.

10. The method according to claim 9, wherein the method further comprising:
    determining whether the temperature correction value is greater than or equal to an upper threshold;
    setting the temperature correction value equal to the upper threshold when the temperature correction value is greater than or equal to the upper threshold;
    determining whether the temperature correction value is less than or equal to a lower threshold when the temperature correction value is less than the upper threshold; and
    setting the temperature correction value equal to the lower threshold when the temperature correction value is less than or equal to the lower threshold.

11. The method according to claim 9, wherein the relational model describes a corresponding relationship among a rate of change of the delta T value, a state of charge (SOC) and a current.

12. The method according to claim 11, wherein the method further comprising:
    calculating the state of charge (SOC) and the current of the rechargeable battery after charging or discharging for a predetermined time period;

acquiring the rate of change of the delta T value between the cell and the adapter board from the relational model according to the state of charge (SOC) and the current; and calculating the delta T value according to a product of the rate of change of the delta T value and the predetermined time period.

13. The method according to claim 12, wherein the current of the rechargeable battery is an average current after the rechargeable battery charging or discharging for the predetermined time period.

14. The method according to claim 11, wherein the relational model is established by:

detecting the temperature of the cell and the temperature of the adapter board when the rechargeable battery is charging or discharging with different currents;

calculating the delta T value between the temperature of the cell and the temperature of the adapter board;

determining the rate of change of the delta T value by analyzing the delta T value and state of charge (SOC) with different current; and establishing the relational model according to the rate of change of the delta T value, the SOC, and the current.

15. The method according to claim 14, wherein the relational model is established by regression analyzing the delta T value, the state of charge (SOC) and the current.

16. The method according to claim 10, wherein the upper threshold is between 4 degrees Celsius and 8 degrees Celsius, and the lower threshold is between −2 degrees Celsius and 2 degrees Celsius.

17. A non-transitory storage medium having stored thereon instructions that, when executed by a processor of an electronic device, causes the processor to perform a temperature correcting method, the electronic device comprising a rechargeable battery, and the rechargeable battery comprising a cell and an adapter board, the method comprising:

detecting temperature T of the adapter board by a sensor;

dividing a charging or discharging process of the rechargeable battery into N predetermined time periods, N being a positive integer;

calculating a delta T value $\Delta T_i$, between the cell and the adapter board according to a relational model after the rechargeable battery is charging or discharging for the i-th predetermined time period;

calculating a temperature correction value $\Delta T$ by accumulating the delta T value $\Delta T_i$ of the i-th of the N predetermined time periods, wherein i=1 to N;

calculating a temperature value $T_{Cell}$ of the cell through the detected temperature T minus the temperature correction value $\Delta T$, wherein, $T_{cell}=T-\Delta T$; and equating the temperature value Tceii as an overall temperature of the rechargeable battery.

18. The non-transitory storage medium according to claim 17, wherein the method further comprising:

determining whether the temperature correction value is greater than or equal to an upper threshold;

setting the temperature correction value equal to the upper threshold when the temperature correction value is greater than or equal to the upper threshold;

determining whether the temperature correction value is less than or equal to a lower threshold when the temperature correction value is less than the upper threshold; and setting the temperature correction value equal to the lower threshold when the temperature correction value is less than or equal to the lower threshold.

19. The non-transitory storage medium according to claim 17, wherein the relational model describes a corresponding relationship among a rate of change of the delta T value, a state of charge (SOC) and a current.

20. The non-transitory storage medium according to claim 19, wherein the method further comprising:

calculating the state of charge (SOC) and the current of the rechargeable battery after charging or discharging for a predetermined time period;

acquiring the rate of change of the delta T value between the cell and the adapter board from the relational model according to the state of charge (SOC) and the current; and calculating the delta T value according to a product of the rate of change of the delta T value and the predetermined time period.

21. The non-transitory storage medium according to claim 20, wherein the current of the rechargeable battery is an average current after the rechargeable battery charging or discharging for the predetermined time period.

22. The non-transitory storage medium according to claim 19, wherein the relational model is established by:

detecting the temperature of the cell and the temperature of the adapter board when the rechargeable battery is charging or discharging with different currents;

calculating the delta T value between the temperature of the cell and the temperature of the adapter board;

determining the rate of change of the delta T value by analyzing the delta T value with different currents and state of charge (SOC); and establishing the relational model according to the rate of change of the delta T value, the SOC, and the current.

23. The non-transitory storage medium according to claim 21, wherein the relational model is established by regression analyzing the delta T value, the state of charge (SOC) and the current.

24. The non-transitory storage medium according to claim 18, wherein the upper threshold is between 4 degrees Celsius and 8 degrees Celsius, and the lower threshold is between −2 degrees Celsius and 2 degrees Celsius.

* * * * *